United States Patent [19]

Gale

[11] 4,284,166

[45] Aug. 18, 1981

[54] PORT DEVICES FOR BASS-REFLEX SPEAKER ENCLOSURES

[76] Inventor: George A. Gale, 7127 S. Ellis Ave., Chicago, Ill. 60619

[21] Appl. No.: 29,724

[22] Filed: Apr. 13, 1979

[51] Int. Cl.$^3$ .............................................. H05K 5/00

[52] U.S. Cl. ..................................... 181/156; 181/199

[58] Field of Search ............... 181/156, 199, 148, 152, 181/153, 147

[56] References Cited

U.S. PATENT DOCUMENTS

| | | | |
|---|---|---|---|
| 2,900,040 | 8/1959 | Novak | 181/156 |
| 3,037,081 | 5/1962 | Carlsson | 181/148 X |
| 3,547,221 | 12/1970 | Hedberg | 181/152 X |
| 3,684,051 | 8/1972 | Hopkins | 181/199 |
| 3,688,864 | 9/1972 | Guss | 181/147 X |
| 3,892,288 | 7/1975 | Klayman et al. | 181/156 |
| 4,006,311 | 2/1977 | Carlsson | 181/147 X |
| 4,126,204 | 11/1978 | Ogi et al. | 181/156 |
| 4,135,600 | 1/1979 | Ogi et al. | 181/156 |
| 4,196,792 | 4/1980 | Grieves et al. | 181/156 |

FOREIGN PATENT DOCUMENTS

| | | | |
|---|---|---|---|
| 104979 | 9/1938 | Australia | 179/1 E |
| 484704 | 5/1938 | United Kingdom | 181/156 |

OTHER PUBLICATIONS

Badmaiegg et al., "How to Build Speaker Enclosures", Howard W. Sams & Co. Inc., 1966, pp. 53–84 and 107–116.

Harry F. Olson, "Elements of Accoustical Engineering", Van Nostrand Company, Inc., 1940, pp. 154–155.

High Fidelity Magazine, "Special Speaker Issue", ABC Leisure Magazine, Inc., June 1975, pp. 54–57.

*Primary Examiner*—L. T. Hix

*Assistant Examiner*—Benjamin R. Fuller

*Attorney, Agent, or Firm*—Neuman, Williams, Anderson & Olson

[57] ABSTRACT

Port devices are provided which are mounted within bass-reflex speaker enclosures behind port openings therein. Each device has an outer mouth opening at the port opening of the speaker and an inner throat opening of smaller area, on the order of two-fifths that of the mouth opening. The devices are in forms including forms having cylindrical or polygonal tubular sections combined with planar inner end wall sections, a stepped form with an additional smaller inner tubular section, and forms with hemispherical and frusto-conical walls. The throat-mouth area ratios and the ratios of the volumes of the devices of those of the enclosures are such as to extend and increase low frequency response without producing booming effects.

12 Claims, 8 Drawing Figures

PORT DEVICES FOR BASS-REFLEX SPEAKER ENCLOSURES

This invention relates to port devices for bass-reflex speakers enclosures and more particularly to devices which extend reproduction of sounds down to lower frequencies while providing attenuation and damping such as to minimize boominess and other resonance effects and distortions. The devices also improve efficiency and output at low frequencies and at the same time, they are relatively simple and inexpensive in construction and reduce the size of enclosure required to provide high quality sound reproduction.

BACKGROUND OF THE INVENTION

A great deal of effort has been expended in attempting to find a speaker enclosure which will efficiently reproduce sounds at the low frequency end portion of the audio spectrum, which will accurately reproduce sounds without booms and other resonant effects and which is reasonable in size and not unduly expensive to manufacture. Simple enclosures in the form of boxes having closed or open backs have serious limitations with respect to response characteristics and with respect to resonance effects and distortions. Resonance effects can be attenuated through the use of acoustically absorbent materials within a cabinet but with a reduction in efficiency and other disadvantages. Folded horn type enclosures have been used with considerable success but have been quite expensive to manufacture and have not been altogether free of resonance effects even after expending great care in design and experimentation in connection therewith. Enclosures utilizing passive radiators and enclosures which are totally enclosed, i.e., accoustic suspension enclosures, have been used with considerable success, but usually at the expense of increased cost and/or reduced efficiency.

The base-reflex ported type of enclosure has been very popular because of its relative simplicity and low cost combined with very good performance. In the bass-reflex type of ported enclosure, a port opening is provided in a wall portion of an enclosure, typically in a portion of the front wall which carries the speaker behind an opening therein, spaced from the port opening. The mass of the air in the port opening cooperates with the compliance of the air volume within the enclosure to produce a phase-shift which may approach 180 degrees. Since the sound emanated from the back of the speaker cone is 180 degrees out of phase with that emanated from the front of the speaker cone, the sound emanated from the port opening may approach an in-phase relationship to the sound emanated from the front of the speaker cone.

To obtain satisfactory results with the bass-reflex ported type of enclosure, the size of the port opening should have the proper relationship to other parameters including the size of the enclosure and the size of the speaker. In general, the size of the port opening may approach that of the speaker opening for larger enclosures and is reduced to a fraction of the size of the speaker opening for smaller enclosures.

Although being generally satisfactory, prior bass-reflex ported types of enclosures have not produced the performance which can be obtained with well designed, and expensive, folded horn type enclosures acoustic suspension enclosures, or enclosures utilizing passive radiators. One problem is that undesired effects such as boominess have been produced and have been found objectional by many listeners. Such effects become more pronounced as the size of the enclosure is decreased. Some degree of improvement has been obtained through the use of ducted port enclosures in which a duct is mounted within an enclosure behind a port, the duct typically being a cylindrical cardboard tube. In such a ducted port enclosure, the size of the enclosure may be reduced but it is still possible to have a significant degree of boominess even with the addition of sound absorbing materials within the enclosure.

Other proposals have been made relating to combination of features of different types of enclosures. Thus, the front of speakers have been coupled to the throats of horns while the backs thereof have been coupled to a port in a bass-reflex enclosure. It has also been proposed to mount a horn on the outside of a bass-reflex enclosure with its mouth coupled to a port. Another arrangement uses both damping material and a port, the damping material being within the port which reduces resonance effects but which also greatly reduces efficiency and output of low frequencies.

Many other proposals have been made and some of them have been used with varying degrees of success. It would be impossible to cite all prior references of interest but they include "How to Build Speaker Enclosures" by Alexis Badmaieff and Don Davis, 1966, published by Howard W. Sams & Co. Inc.; "Elements of Acoustical Engineering" by Harry F. Olson, published by D. Van Nostrand Company, Inc. 1940; a special "Speaker Issue" of "High Fidelity" Magazine, published by ABC Leisure Magazine, Inc. 1975; Carlsson U.S. Pat. No. 3,037,081, May 29, 1962; Hedberg U.S. Pat. No. 3,547,221, Dec. 15, 1970; Hopkins U.S. Pat. No. 3,684,051, Aug. 15, 1972; Guss U.S. Pat. No. 3,688,864, Sept. 5, 1972; Klayman, et al. U.S. Pat. No. 3,892,288, July 1, 1975; and Carlsson U.S. Pat. No. 4,006,311, Feb. 1, 1977.

SUMMARY OF THE INVENTION

This invention was evolved with the general object of further improving upon the bass-reflex ported type of enclosure. The invention is based upon the recognition of the nature of problems associated with prior disclosures and upon the discovery of constructions which provide improved results.

In prior ported enclosures in which an open port alone is provided or in which an open port duct is provided behind an open port, there is a relatively free movement of air and a relatively small back pressure on the cone or diaphragm of the speaker. In such arrangements, the combination of the acoustical compliance of the enclosure and the effective mass of the air moving outwardly and inwardly through the port or through both the port and the duct may readily produce resonance to cause a booming effect at a certain low frequency. To prevent booming, an absorbing material might be added at the port, in the duct or in some other portion of the enclosure. However, such as absorbing material causes a large loss in energy and reduced efficiency and output. Thus, some of the advantages of the bass-reflex enclosures would be diminished or would not be realized at all.

In accordance with this invention, devices are provided which will operate much better than an absorbent material in reducing booming and which at the same time produce a minimum loss of energy to obtain increased efficiency and output.

In one embodiment, a port device is provided including a cylindrical tube positioned within a ported enclosure with one end thereof at a port opening of the enclosure, the tube being thus positioned in a manner similar to the positioning of tubular ducts in prior enclosures. However, instead of having an open inner end for the tube, a wall is provided which has a circular central opening in coaxial relation to the tube, the opening being of smaller diameter than the diameter of the tube and having a substantially smaller area. For example, the diameter of the opening may be such that the area of the opening is about two-fifths the area of the tube.

It is found that with this change, greatly improved results are achieved. No booming effects are produced and at the same time, the efficiency is increased and it is found that an increase in output of 4 decibels or more may be obtained at 40 Hz, comparing an enclosure having a device constructed in accordance with the invention installed therein with the same enclosure having a conventional straight tube.

There are difficulties in attempting to provide an exact scientific explanation for such remarkable improvements in results. However, it is believed that when the air displaced by the backward travel of the speaker cone is forced through the small opening in the wall at the inner or rearward end of the tube, the action is similar to that defined by Pascal's Principle of Hydraulics, here applied to air rather than a liquid. The air entering the opening moves into a larger volume and mass of air in such a way that for every linear distance unit of penetration of air through the small opening and into the tube, the air within the tube will move a fraction of such unit. For example, if in response to an excursion of the speaker cone, the air moves 1 inch into the tube, the air within the tube may move only $\frac{1}{3}$ of an inch.

As a result, the speaker cone is subjected to a more constant or even pressure and the momentum which can be imparted to air in the small opening is reduced. In addition, as compared to a conventional duct, the speaker is required to move a larger volume of air in relation to the size of the opening.

Thus, the speaker cone is subjected to additional back pressure to achieve the objectives of the use of a damping material but with much less loss of energy. Moreover, the action is obtained in the absence of conditions which might produce peak resonance effects at certain frequencies. Furthermore, the high efficiency and output capabilities of the bass-reflex design are preserved without resonances and without energy absorbing damping material.

With regard to efficiency and output, it is noted that the air enters the small opening, moves through the tube and exits from the port opening with no substantial decrease in total energy. However, there is a significant transformation since the energy is expended over a much larger area and output is very substantially increased by this feature, especially at the low frequency limit of the reproduced range.

An important aspect of the invention is that the degree of effective damping obtained is controlled by the ratio between the exit or mouth area at the port opening of the enclosure and the small opening or throat area at the inner end of the tube, the degree of damping being increased by increasing the ratio. It is also noted that the device can be quite short in length and yet produce results which are superior to those obtained with a conventional duct of much larger length. It is further noted that the length of the tube may apparently be reduced by a factor equal to the ratio between the cross sectional areas of the port device at its mouth and its throat.

The aforementioned construction using a simple cylindrical tube and an end wall with a circular opening works very well and has the advantage of simplicity and economy. However, alternative arrangements may be used including a tube of triangular, square, rectangular or other polygonal shape, a conical member or a hemispherical member there being in each case a larger mouth area at the port opening of the enclosure and a smaller throat area at the inner end of the device within the speaker enclosure. Mouth openings having a shape other than circular may be used. Also, a progression of two or more tubes with progressively smaller sizes may be used to obtain a stepped construction. One device may be used alone and it is also possible to use a plurality of devices in one enclosure.

This invention contemplates other objects, features and advantages which will become more fully apparent from the following detailed description taken in conjunction with the accompanying drawings.

DESCRIPTION OF PREFERRED EMBODIMENTS

Figure 1:
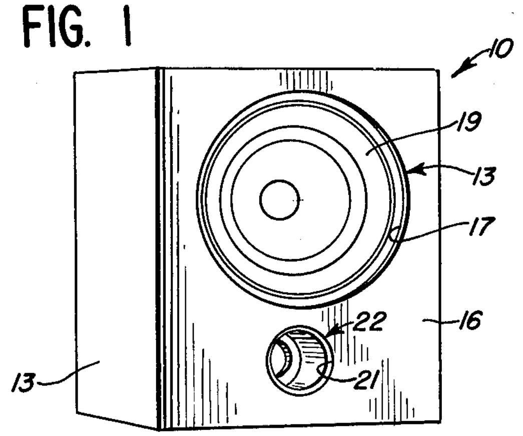
FIG. 1 is a perspective view of a bass-reflex speaker enclosure in which a port device according to the invention is installed.
Figure 2:
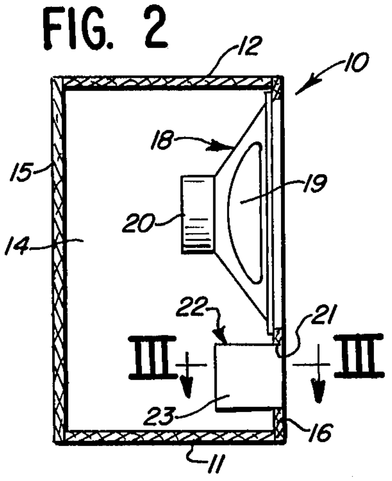
FIG. 2 is an elevational sectional view through the speaker enclosure of FIG. 1, taken substantially along line II—II thereof.
Figure 3:
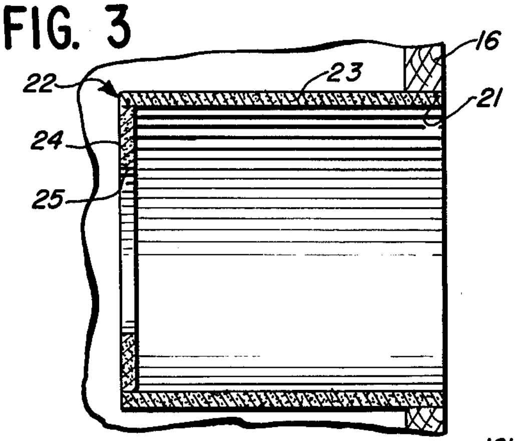
FIG. 3 is a sectional view on an enlarged scale, taken substantially along line III—III of FIG. 2 and showing details of the construction and mounting of the port device.

Reference numberal 10 generally designates a bass-reflex speaker enclosure to which the invention is applied, the enclosure 10 including bottom and top walls 11 and 12, side walls 13 and 14, a rear wall 15 and a front wall 16. The front wall 16 has a speaker opening 17 therein and supports a speaker 18 on its rearward side behind opening 17, the speaker 18 including a cone 19 and a driver structure 20.

The front wall 16 also has a port opening 21 therein, below the speaker opening 17, and a port device 22 is mounted on the front wall 16 behind the port opening 21.

The port device 22 is constructed in accordance with the principles of the invention and includes a cylindrical tube 23, the forward end of which is fitted in the port opening 21, a suitable adhesive being provided between the outer surface of the forward end portion of tube 23 and the inner surface of the wall 16 at the opening 21.

The cylindrical tube 23 is similar to tubes as ducts used in certain prior art enclosures, but in the device 22 the inner end of the tube 23 is not completely open. Instead, a circular wall member 24 secured to the inner end of the tube 23 as by providing an adhesive between the outer surface of member 24 and an inner surface portion of tube 23. Wall member 24 has an opening 25 therein which may preferably be centrally located in alignment with the axis of tube 23.

The enclosure 10 in the illustrated arrangement may have an inside height dimension of 15 inches, an inside width dimension of 14.5 inches and an inside depth dimension of 14 inches to provide a volume (excluding construction members) of 2830 cubic inches. The speaker 18 may be a 12 inch unit of a type such as generally used in bass-reflex enclosures. A unit with a cloth roll suspension sold as Radio Shack Model No. 40-1304 is suitable, but is only one example of a unit which might be used. The tube 23 may be a cardboard tube having a length of 4.25 inches and an inside diameter of 3 inches. The wall 24 may be a fiberboard insert and the diameter of the opening 25 may be 1.87 inches to provide an area equal to about two-fifths the internal cross-sectional area of the tube 23.

It will be understood that these dimensions are given by way of illustrative example only and are not to be construed as limitations except that with respect to any given speaker and enclosure combinations having characteristics, dimensions and volumes of the same order of magnitude as those in the foregoing example, the size of the port device 22 in relation to the size of the enclosure should be in approximately the same proportions as in the example. Best results are achieved by so selecting approximate dimensions for a device and then making adjustments by trial and error until an operation is obtained in which the response is both extended to as low a frequency as possible and increased as much as possible without producing response peaks or booming effects.

The size of the opening 25 is critical. In the example, its area is equal to two-fifths of the cross-sectional area of the tube 23 and such a ratio is recommended as a starting point but is should preferably be adjusted until the low frequency response is extended and increased as much as possible without producing booming.

Figure 4:
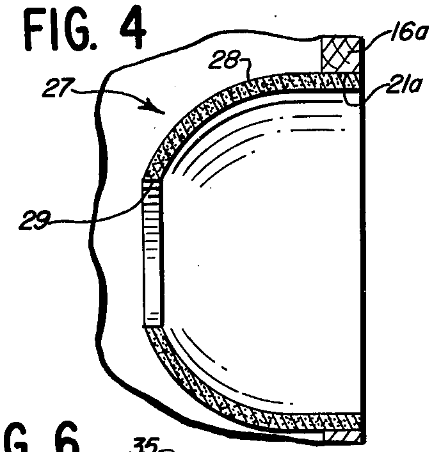
FIG. 4 is a sectional view similar to FIG. 3 but showing a modified device having a generally hemispherical shape.

It will be noted that the opening 25 forms in effect a throat opening at one end with a larger mouth opening at the opposite ends, at the port opening 21 of the enclosure, and since it is found that the restricted area of the opening 25 in relation to that of opening 21 is critical, other constructions might be used to obtain such a relationship and thereby obtain improved results. FIG. 4 illustrates a modified device 27 which comprises a hollow generally cup-shaped hemispherical member 28 having a rim portion secured within a port opening 21*a* in an enclosure wall 16*a* and having an opening 29 in centered relationship on the axis of the port opening 21*a*.

Figure 5:
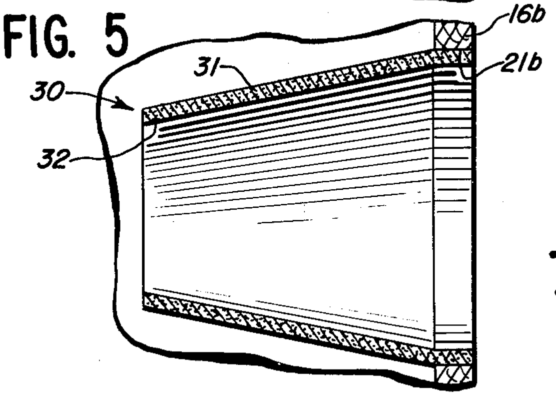
FIG. 5 is another sectional view similar to FIG. 3 but showing another modified device having a generally conical shape.

FIG. 5 illustrates another modified device 30 which comprises a member 31 of frusto-conical shape having a larger end secured within a port opening 21*b* in an enclosure wall 16*b*, a throat opening 32 being provided at the smaller end of the member 31.

Figure 6:
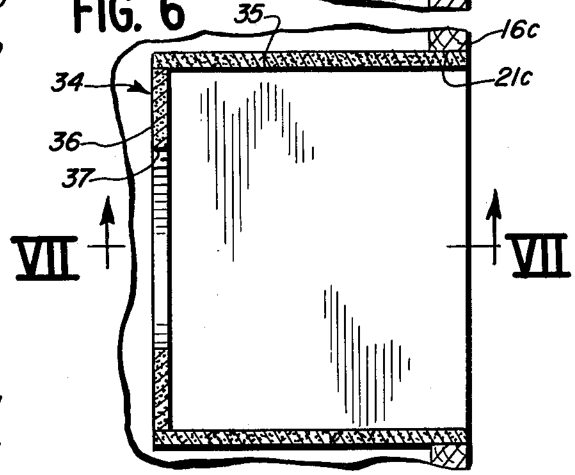
FIG. 6 is still another sectional view similar to FIG. 3 but showing still another modified device having a rectangular shape.
Figure 7:
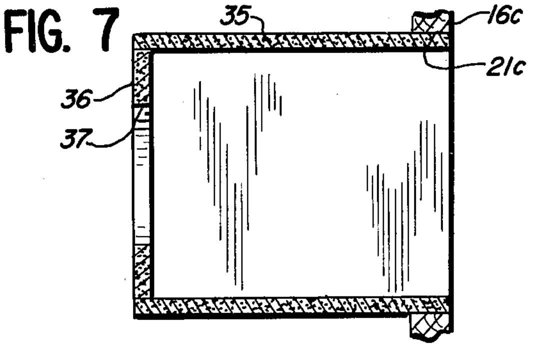
FIG. 7 is a sectional view taken substantially along line VII—VII of FIG. 6.

FIGS. 6 and 7 illustrate yet another modified device 34 which comprises a hollow rectangular member 35 having a forward peripheral portion secured within a port opening 21*c* in an enclosure wall 16*c*. A rearward wall member 36 is secured within the rearward end of member 35 and has central opening 37 therein, forming the throat opening of the device.

Figure 8:
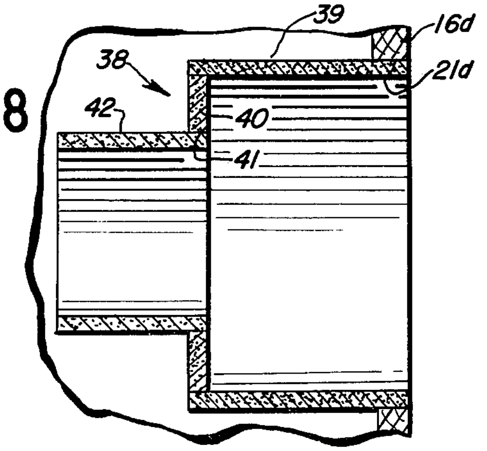
FIG. 8 is another sectional view similar to FIG. 3, showing yet another modified device according to the invention, having a stepped construction.

FIG. 8 illustrates still another modified device 38 which includes a cylindrical tube 39, the forward end of which is secured in a port opening 21*d* in an enclosure wall 16*d*. A circular wall member 40 is secured to the inner end of tube 39 and has a central opening 41 therein. A second tube 42 which is smaller than tube 39 has a forward end secured in the opening 41. Thus, the device 38 is similar to the device 22, but with the addition of a second smaller tube to provide a stepped construction.

The concept of device 38 can be carried forward to provide additional steps, if desired. It will also be understood that shapes other than those illustrated may be used and that in each case, dimensions are chosen and established in the manner as set forth in the foregoing discussion to extend and increase the low frequency response as far as possible without producing booming or other resonance effects.

It will be understood that modifications and variations may be effected without departing from the spirit and scope of the novel concepts of this invention.

What is claimed is:

1. A port device for a hollow, bass-reflex speaker enclosure, said speaker enclosure comprising a first wall portion having a speaker opening therein and a speaker mounted behind said speaker opening, a second wall portion having a port opening therein, and third wall portions which wall portions define an acoustic chamber wherein the air within that chamber transmits energy from the speaker to the port, said port device comprising: a hollow structure having a mouth opening at one end thereof and having a smaller throat opening at an opposite end thereof, said port device being mounted within said enclosure with said mouth opening at said port opening of said enclosure and with said throat opening inside said enclosure in communication with said acoustic chamber.

2. In a device as defined in claim 1, the area of said throat opening being on the order of two-fifths that of said mouth opening.

3. In a port device as defined in claim 1, the ratio of the area of said throat opening to the area of said mouth opening and the ratio of the volume of the space within said port device to the volume within said speaker enclosure being in proportionate relation to those ratios obtained with a port device having a circular 3 inch diameter mouth opening, a circular 1.87 inch diameter throat opening and a length of 4.25 inches positioned in an enclosure having a volume of 2830 cubic inches and having a 12-inch speaker mounted behind a speaker opening of the same size to extend the low frequency response to as low a frequency as possible and increase the low frequency response as much as possible without producing booming or other resonance effects.

4. In a device as defined in claim 1, said hollow structure including a tubular wall section having an outer end secured to said second enclosure wall portion at said port opening therein and including a generally planar inner end wall having an opening therein and disposed at the inner end of said tubular wall.

5. In a device as defined in claim 4, said tubular wall section being generally cylindrical.

6. In a device as defined in claim 4, said tubular wall section being generally polygonal.

7. In a device as defined in claim 6, said tubular wall section being generally rectangular.

8. In a device as defined in claim 4, said throat opening being defined by said opening in said inner end wall.

9. In a device as defined in claim 4, a second tubular wall section having an internal size and shape substantially the same as that of said opening in said inner end wall and projecting outwardly therefrom.

10. In a device as defined in claim 9, said throat opening being defined by an inner end of said second tubular wall section.

11. In a device as defined in claim 1, said hollow structure including a generally hemispherical wall section.

12. In a device as defined in claim 1, said hollow structure including a generally frustoconical wall section.

* * * * *